(12) United States Patent
Hartwig et al.

(10) Patent No.: US 8,912,717 B2
(45) Date of Patent: Dec. 16, 2014

(54) ILLUMINATION DEVICE INCLUDING PHOSPHOR ELEMENT AND OPTICAL SYSTEM

(75) Inventors: Ulrich Hartwig, Berlin (DE); Julius Muschaweck, Gauting (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 13/981,618

(22) PCT Filed: Jan. 31, 2011

(86) PCT No.: PCT/EP2011/051294
§ 371 (c)(1),
(2), (4) Date: Jul. 25, 2013

(87) PCT Pub. No.: WO2012/103919
PCT Pub. Date: Aug. 9, 2012

(65) Prior Publication Data
US 2013/0307400 A1    Nov. 21, 2013

(51) Int. Cl.
*H01J 1/62* (2006.01)
*H01J 63/04* (2006.01)
*H05B 33/22* (2006.01)
*H01L 33/50* (2010.01)
*H01L 33/58* (2010.01)

(52) U.S. Cl.
CPC .............. *H05B 33/22* (2013.01); *H01L 33/505* (2013.01); *H01L 33/58* (2013.01)
USPC ............................................ 313/498; 313/46

(58) Field of Classification Search
CPC ............... F21K 9/50; F21K 9/56; F21K 9/00; F21V 7/0008; F21V 7/0033; F21V 13/04; F21V 29/004; H01L 33/50; H01L 33/60; H01L 33/505; H01L 33/58; H01L 33/507; F21Y 2101/02; F21Y 2101/025; H05B 33/22
USPC ............ 313/46, 498, 501, 502, 503; 362/293; 257/9, 98, 101, 102
See application file for complete search history.

(56) References Cited

U.S. PATENT DOCUMENTS

| 6,576,930 | B2* | 6/2003 | Reeh et al. ........................ 257/98 |
| 7,040,774 | B2* | 5/2006 | Beeson et al. .................... 362/84 |
| 2005/0139851 | A1 | 6/2005 | Sato |
| 2006/0203468 | A1 | 9/2006 | Beeson et al. |
| 2007/0297179 | A1 | 12/2007 | Leung et al. |
| 2009/0052158 | A1* | 2/2009 | Bierhuizen et al. ............. 362/84 |
| 2010/0109036 | A1 | 5/2010 | Chen et al. |

FOREIGN PATENT DOCUMENTS

WO    2009122339 A1    10/2009

* cited by examiner

*Primary Examiner* — Nimeshkumar Patel
*Assistant Examiner* — Glenn Zimmerman

(57) ABSTRACT

An illumination device with an exit surface for pump light propagation with a main propagation direction and a phosphor element for converting the pump light into converted light is disclosed. Further, an optical system with a reflection surface is provided for deflecting the pump light, where the reflection surface reflects the pump light with a directional component opposite to the main propagation direction and onto the phosphor element.

12 Claims, 4 Drawing Sheets

# US 8,912,717 B2

ILLUMINATION DEVICE INCLUDING PHOSPHOR ELEMENT AND OPTICAL SYSTEM

RELATED APPLICATIONS

The present application is a national stage entry according to 35 U.S.C. §371 of PCT application No.:PCT/EP2011/051294 filed on Jan. 31,2011.

TECHNICAL AREA

The present disclosure relates to an illumination device including a phosphor element for converting pump light into converted light and including an optical system for guiding the pump light.

BACKGROUND

Currently developed light sources are distinguished in relation to conventional incandescent lamps by an increased energy efficiency, however, the emitted light is often limited to a relatively narrow spectral range in relation to the incandescent lamps, which have broadband emission as thermal radiators. For example, if a light-emitting diode (LED) is provided as a light source, which illustrates the present disclosure, but is not to be restrictive, to change the spectral properties of the light, a phosphor is typically applied directly to the LED chip (chip level conversion) or the LED chip is covered by an epoxy resin containing a phosphor (volume conversion). In operation, the phosphor is excited using shorter-wave light (pump light) in comparison to the emission light and emits longer-wave light (converted light), wherein the light emitted overall can then result as a superposition of the converted light with a component of the pump light which is not absorbed by the phosphor. An LED emitting in the blue longwave range can thus result in a white light source when combined with a yellow phosphor, for example.

DESCRIPTION

The various embodiments of the disclosure provide a particularly advantageous embodiment of an illumination device including a phosphor element.

Various embodiments of the disclosure provide an illumination device which has, in addition to the phosphor element and a pump light source including an exit surface for pump light, which, in relation to this exit surface, has a main propagation direction formed as the focal point of propagation directions weighted according to the power, an optical system including a reflection surface to redirect at least a part of the pump light propagating in the main propagation direction such that it is incident on the phosphor element with a directional component opposing the main propagation direction, i.e., enclosing an angle of 180° therewith, which then emits converted light with a directional component oriented parallel to the main propagation direction, i.e., is operated in reflection.

The phosphor element made of, for example, a cesium-doped or europium-doped phosphor is thus not operated in transmission as described at the beginning, but rather is operated in reflection. One advantage of this can be, for example, that the mixture of pump light and converted light may be decoupled from the thickness of the phosphor element. For this purpose, a material which reflects the pump light, for example, titanium oxide, can be admixed at a specific concentration with the phosphor, so that the pump light is then completely reflected at a penetration depth (which decreases with increasing concentration) dependent on the concentration. A route is therefore also predefined for the interaction of pump light and phosphor, so that the ratio of converted light to reflected pump light is independent of the layer thickness for layers having at least the penetration depth. The light mixture is therefore no longer dependent on the phosphor element thickness, but rather can be adjusted via its material properties. Since the phosphor element thickness can be subject to manufacturing-related variations, scattering of the white point within a component series may thus be reduced, for example.

A further advantage of the phosphor element operated in reflection can also be that the rear side does not have to be kept free for the light guiding and therefore can be used for installation or, for example, for cooling of the phosphor element, for example, using a cooling body made of metal. In contrast, for a phosphor element operated in transmission, a transparent cooling body, for example, made of sapphire, would have to be provided, which is substantially more complex, also in a cost aspect.

However, one disadvantage of the phosphor element operated in reflection can result if the optical paths of pump light and converted light are at least regionally coincident, whereby, for example, in the case of a pump light source provided as an "incident light source" opposite to the phosphor element, shading of the phosphor element and therefore a reduced light yield can occur. Because according to the disclosure an optical system having a reflection surface for redirecting the pump light is provided, the pump light source can ideally be taken out of the optical path of the converted light and shading can be at least reduced. The shading by a mirror, for example, can specifically be substantially restricted to its reflection surface, while in contrast a pump light source typically shades a substantially larger region in relation to the surface which effectively emits pump light.

According to the disclosure, the pump light, which is emitted by a laser (light amplification by stimulated emission of radiation) or an LED, for example, has a directional component opposing the main propagation direction after the redirection, i.e., it encloses an angle greater than 90° with the main propagation direction (for the reflected pump light, in this consideration, a proportion oriented parallel to the main propagation direction but opposite thereto is differentiated from a proportion oriented perpendicular thereto, however); the greater the angle, the greater the proportion of the directional component opposite to the main propagation direction. The pump light is thus at least proportionally reflected "back" to the phosphor element by the reflection surface with respect to direction, because of which a pump light source does not necessarily have to be arranged in the optical path of the converted light.

An "exit surface for pump light" can be, for example, the surface region of an LED provided for the light emission, an image thereof, or, for example, also the exit opening of an optical waveguide coupled thereon. In addition, the pump light itself can also already be wavelength-converted, for example, if an ultraviolet radiation source is used, into blue light by means of a suitable phosphor. In this regard, if a propagation of the pump light or converted light is referred to in the context of the present disclosure, this means a device designed for such a propagation and not necessarily a device in which a corresponding propagation also actually occurs. If reflection or transmission is referred to without further restriction, this does not exclude a respective different behavior provided in a smaller proportion, i.e., in particular a behavior which cannot be completely avoided in principle or which is not quantitatively substantial.

According to a first embodiment, the pump light is incident on a surface of the phosphor element, with which the exit surface is arranged in a plane. A recess for the exit surface, which is used to accommodate the pump light source, is preferably provided in the phosphor element surface. Through this arrangement, the illumination device can be constructed compactly with respect to directions transverse to the main propagation device.

In a further embodiment, one region of the reflection surface extends transversely to the main propagation direction and is designed for the purpose of at least partially transmitting the converted light. "Transversely" means in this case an angle (respectively the smaller one) of at least 45°, preferably at least 55°, 65°, 75°, to the main propagation direction. Then, for example, a dichroic mirror can be provided as the reflection surface, so that the light is transmitted or reflected depending on the wavelength, for example, using a multilayer system constructed as an interference filter. If the reflection and transmission properties are selected such that the pump light is reflected, but the converted light is transmitted (in any case in a respectively larger proportion), a large-area reflection surface can advantageously be implemented, which nonetheless does not shade the phosphor element with respect to the converted light.

Since in this case at least the majority of the pump light which is reemitted from the phosphor element is not transmitted, the use of a dichroic mirror is also advantageous in particular if solely or predominantly converted light is to be provided for a further use. Such a full conversion can be of interest, for example, for safety reasons in the case of a pump light source emitting in the UV range or in the case of applications which do not require white light, but rather light of a specific color (then corresponding to the phosphor), i.e., for example, signal lights such as turn signals, brake lights, or emergency lights.

In a further embodiment, the reflection surface, which at least partially transmits the converted light, is a curved interface, which faces away from the phosphor element, of a transparent body, which has a first index of refraction and borders on a medium having a smaller second index of refraction, preferably on air having an index of refraction of approximately 1 in the visible range, so that the interface is implemented as a reflection surface and the redirection occurs by way of total reflection. The index of refraction $n_{tk}$ of the transparent body in the visible range is preferably at least (1.2), particularly preferably at least (1.4), and at most (2.0), particularly preferably at most (1.56).

The pump light, preferably at least a 70% proportion thereof, is therefore redirected along the curved surface toward the phosphor element. This phosphor element then emits converted light, for example, approximately as a Lambert radiator in a hemisphere, i.e., having a local focal direction which is respectively oriented normally to the phosphor element surface. This focal direction of the converted light will at least regionally deviate from the direction of the incident pump light such that the angle of incidence (to the normal) of the converted light is less and total reflection does not occur.

The pump light redirection by total reflection can, for example, also be particularly advantageous in relation to the above-described embodiment having a dichroic mirror, additionally to or independently of the possibility of light mixing, if, for example, for a mass-produced product, a cost-effective alternative is sought to the multilayer system provided for the interference. A corresponding transparent body can be ground or cast, for example, from a plastic material, for example, and optionally does not require further surface treatment, at least not over a large area.

In a further embodiment, the interface of the transparent body having an index of refraction $n_{tk}$ is curved such that in a sectional plane, which is parallel to the main propagation direction and extends through the exit surface, a curved line corresponding to the interface is implemented with respect to a point lying in the exit surface for the pump light such that a connecting line from this point to the curved line encloses an angle $\leq \arccos(1/n_{tk})$ with the curved line; as the point lying in the exit surface, an edge point thereon is preferably selected. The sectional plane, which is parallel to the main propagation direction, is preferably placed in a focal point of the exit surface, i.e., through the geometric surface focal point in the mathematical meaning.

On a corresponding curved interface, which respectively meets the design condition in a plurality of sectional planes lying parallel to the main propagation direction going through the exit surface, the pump light originating from the exit surface is totally reflected, in order to then be incident on the phosphor element, optionally also after repeated total reflection along the interface. Via the proportion of the region of the interface meeting the design condition to the total interface, for example, the ratio of converted light to transmitted pump light can also be set, i.e., the light available for light mixing.

The design condition is then met for connecting lines together subtending at least an angle range of 30°, in this sequence increasingly preferably of at least 40°, 50°, 60°, 70°, wherein these connecting lines, in a further embodiment, enclose an angle with the exit surface for the pump light of at least 80°, in this sequence increasingly preferably at least 82°, 84°, 86°, 88°, 90°, and of at most 185°, preferably at most 182.5°, and particularly preferably at most 180°.

The design condition is thus not necessarily met for a region located above the exit surface in the main propagation direction, because this would require an interface tapering to a point and could therefore be problematic with respect to production. The design condition is also not necessarily met in an edge-side region perpendicular to the main propagation direction, because otherwise an interface extending far in this direction would be necessary.

In a further embodiment, the curved line is bent at a plurality of points and is preferably otherwise respectively linear, i.e., the interface is thus implemented as faceted. For example, in the case of bending points located close to one another or also corresponding tilted subregions, the design condition can nonetheless respectively be met over an entire subregion, even if it is linear and not curved.

For example, imaging of the phosphor element can be avoided by the faceting of the interface, so that, for example, in the case of an inhomogeneously illuminated phosphor, nonetheless a certain degree of mixing of the light is achieved.

In a further embodiment, curved lines corresponding to the design condition are provided in a plurality of sectional planes, wherein the curved lines of the respective sectional planes can be converted into one another either by a rotation about an axis parallel to the main propagation direction or by a parallel displacement along an axis perpendicular to the main propagation direction. The interface of the transparent body and preferably also the transparent body itself are thus at least regionally constructed as rotationally or translationally symmetrical.

The rotationally-symmetrical arrangement can also be combined in particular with the above-mentioned exit surface, which is provided in a recess of the phosphor element, so that the recess is then provided centrally in a phosphor element which is also rotationally-symmetrical to the main propagation direction, possibly neglecting the recess.

Also independently of this symmetrical embodiment, in three dimensions, a transparent body which meets the design condition in a plurality of sectional planes also has, according to a preferred embodiment, a surface area perpendicular to the main propagation direction which corresponds to at least 110 times, particularly preferably at least 200 times, but at most 1700 times, particularly preferably at most 1000 times the exit surface, however.

The surface area of the transparent body and therefore a surface area of the phosphor element, which is substantially matched thereto, is thus at least two orders of magnitude larger than the exit surface in this case, because of which only a smaller proportion of the light emitted by the phosphor element is reflected back into the exit surface. If pump light source and phosphor element can be approximated as Lambert radiators, for example, i.e., they emit in an equally large spatial angle range, because of the larger area of the phosphor element, its etendue is thus also substantially greater. The etendue, i.e., the product of area and projected spatial angle (Field Guide to Illumination, Angelo V. Arecchi et al., SPIE Press 2007), characterizes an extension of light in relation to the surface angle and spatial angle; therefore, only a smaller part of the phosphor element etendue "fits" in the etendue of the exit surface, i.e., only a corresponding smaller part of the converted light can thus be reflected back into the exit surface.

The surface area of the transparent body is given an upper limit for practical reasons, on the other hand, because otherwise the transparent body would become arbitrarily thin in the edge regions and thus would be in danger of damage or would be difficult to produce, for example. Furthermore, a large phosphor element corresponding to the transparent body would then also result in increased material costs.

In a further embodiment, the exit surface is implemented as rectangular and the transparent body has a thickness in the main propagation direction which is at least 0.8 times, preferably 1 time, a shorter edge of the rectangular exit opening, but at most 5 times, preferably at most 3.4 times, a longer edge of the rectangular exit opening. For example, if one proceeds in the case of an LED from a light-emitting surface having edge lengths between 0.5 mm and 5 mm, a transparent body having a thickness between 0.4 mm and 25 mm results, which can therefore be handled well and is also producible in mass production, for example.

In a further embodiment, a region, which is arranged originating from the exit surface in the main propagation direction, of the interface facing away from the phosphor element is additionally surface treated. The region may thus be mirrored or diffusely reflective for reflection of pump light propagating in the main propagation direction, for example, because a totally-reflecting interface would otherwise have to taper at an acute angle in a funnel shape toward the exit surface, which can result in manufacturing difficulties.

On the other hand, the surface treatment may also diffusely scatter the pump light and thus provide it for mixing with the converted light.

In a further embodiment, a layer made of immersion material is provided for an index of refraction adaptation, via which both the phosphor element and also the exit surface are optically connected to an outer surface of the transparent body facing toward the phosphor element. On the one hand, Fresnel losses, which occur at interfaces between materials having different indices of refraction, can be reduced by the immersion material and, on the other hand, refraction losses may also be decreased, which occur in the case of the transition from phosphor to air, for example. The immersion material is different from the transparent body, i.e., it is not implemented integrally therewith, and preferably also consists of another material.

The exit surface is preferably arranged in a plane with the phosphor element surface, so that the immersion layer has a substantially constant thickness, if the outer surface of the transparent body facing toward the phosphor is parallel to this plane.

In another embodiment, a transparent body made of plastic material, preferably made of silicone, is molded onto the exit surface and the phosphor element, for example, by casting the plastic material in a mold delimited by the phosphor element and the exit surface. Ideally, there is then no gap between phosphor element/exit surface and transparent body, so that the light yield can also be improved without an additional immersion material; the production costs may advantageously also be reduced simultaneously because of the reduced number of materials.

In a further embodiment, the transparent body has a lateral outer surface which is oriented along the main propagation direction but not necessarily parallel thereto, which is additionally surface treated for the purpose of pump light reflection, and which thus delimits a lateral light exit from the optical system. For this purpose, mirroring or also a diffusely reflective layer can be provided, for example.

A peripheral lateral outer surface oriented along the main propagation direction can also improve the handling capability of the transparent body, because a region which is not provided for the transmission of light is possibly better suited for applying a tool.

In a further embodiment, a pump light source, preferably an LED, and a cooling body are provided, wherein the pump light source and the phosphor element are arranged on the same cooling body. By way of this arrangement, which is possible due to the back reflection of the pump light according to the disclosure, material costs may advantageously be reduced and the logistical expenditure in manufacturing can be decreased, because fewer individual parts must be kept ready.

Because thermal paths between the pump light source and the phosphor element are at least partially blocked, for example, by slots or by material inserts having elevated thermal conductivity, in the cooling body, which is otherwise integrally implemented, in a further embodiment, pump light source and phosphor element can nonetheless be at least partially thermally decoupled, which reduces mutual heating.

In a further embodiment, which can also be considered as disclosure independently of the features of the main claim and is to be disclosed in this form, the phosphor element is subdivided into regions and has a plurality of phosphors designed to emit respectively differing light, wherein one such phosphor is then respectively arranged in a plurality of regions. In one region, precisely one phosphor selected from a plurality of different phosphors is thus provided in each case. "Phosphor" means in this case, and also in the entire disclosure, both a specific phosphor type, for example, cesium-doped YAG, and also mixtures of phosphor types.

The plurality of phosphors respectively designed to emit different lights can also be implemented, for example, by one phosphor type provided once in pure form and a phosphor mixture comprising this phosphor type. In this case, said phosphor type is then provided in all regions of the phosphor element, however, the pure phosphor type and the phosphor mixture are respectively designed to emit different lights and therefore represent two different phosphors.

The subdivision according to the disclosure of a phosphor element including a plurality of phosphors into regions, in which then respectively one phosphor is always exclusively provided (in the surface distribution), has the advantage that in contrast to mixing of the phosphors required for the light conversion, an interaction between the absorption spectra and the emission spectra can be reduced. Otherwise, for example, a phosphor provided for the emission of red light, which is to be excited using a blue pump light source, could also absorb a part of the spectrum emitted by a green phosphor, which would result in an unintended excess elevation of the red spectral range and a reduction of the green spectral range. Such an interaction can be reduced by providing at least specific phosphor types separately from one another in regions.

The phosphor element regions are nonetheless not necessarily perceived as separate from one another in the far field, for example, if mixing of the converted light is performed using a non-imaging optic.

DETAILED DESCRIPTION

Figure 1:
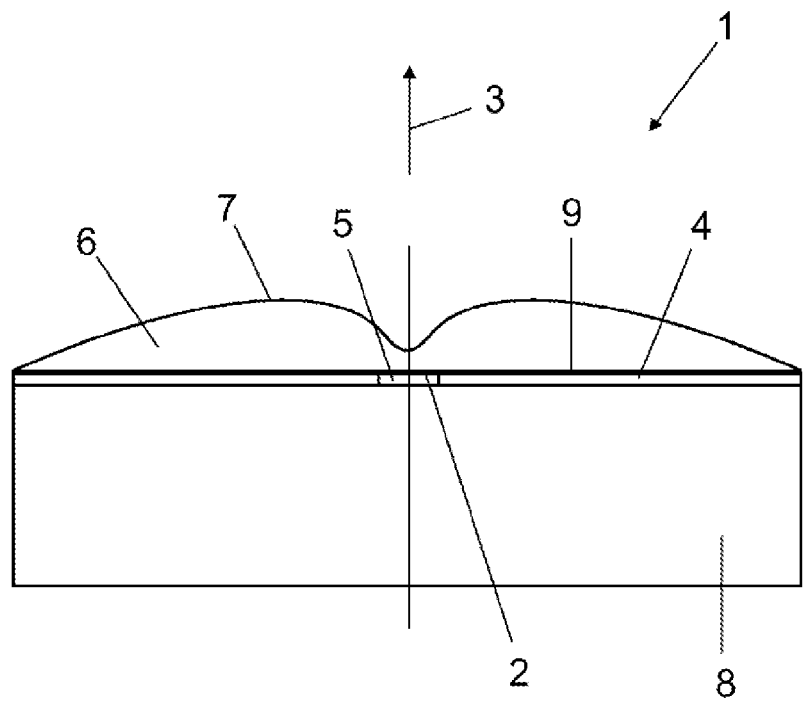
FIG. 1 shows an illumination device comprising an LED, a phosphor element, and a transparent body having a curved interface for the total reflection of pump light.

FIG. 1 shows an illumination device 1 including an exit surface 2 for pump light, which propagates in a main propagation direction 3, and comprising a phosphor element 4 for the conversion of the pump light. The exit surface 2 is the light-emitting surface of an LED 5, which emits pump light in a hemisphere in the main propagation direction 3. The phosphor element 4 is arranged with the LED 5 in a plane, i.e., it is not directly illuminated by the pump light emitted by the LED 5.

Therefore, a transparent body 6 having an outer surface 7, which faces away from the phosphor element 4 and the LED, is provided for redirecting the pump light, with which the transparent body made of silicone (index of refraction $n_s \approx 1.2$) borders air, and therefore a medium having a lower index of refraction ($n_{air} \approx 1$). For this reason, pump light beams originating from the LED 2, the angle of which to the interface 7 does not exceed a specific value, are totally reflected on the interface 7 and thus, optionally also after repeated total reflection, redirected back to the phosphor element 4.

The phosphor 4, which is made of cesium-doped YAG and/or europium-doped strontium orthosilicate, absorbs the totally reflected pump light and emits converted light; the emission of the converted light also occurs in a hemisphere, the focal direction of which corresponds in this case to the main propagation direction 3. Since the curvature of the interface 7 is optimized in relation to the exit surface 2 (cf. explanations of FIG. 3), on the one hand, however, and the phosphor element surface and therefore its etendue is substantially greater than the exit surface 2 and its etendue, on the other hand, the light emitted by the phosphor 4 thus does not "fit" in the exit surface 2, only a small part of the light emitted by the phosphor element is reflected back to the LED; the larger part is transmitted through the interface 7 and is available for an application.

Since thermal losses arise both due to the operation of the LED and also during the pump light conversion in the phosphor element, for example, due to the Stokes shift, the phosphor element 4 and the LED 5 are provided on a shared cooling body 8.

A layer 9 made of an immersion material, the index of refraction of which is between that of the phosphor element 4 and that of the transparent body 6, is provided between an outer surface of the transparent body 6 facing toward the phosphor element 4 and the phosphor element 4 or LED 5 to reduce Fresnel and refraction losses.

In the case of an LED 5 which approximately emits light in a hemisphere as a Lambert radiator, a total reflection is difficult to implement both in a region around the axis of symmetry of the hemisphere and also in a region close to the "sectional plane" (which divides the sphere into two halves), because in the first mentioned case a funnel structure tapering to the point would be necessary and in the latter case diameters which become arbitrarily large would be necessary; both can cause manufacturing problems, inter alia.

Figure 2:
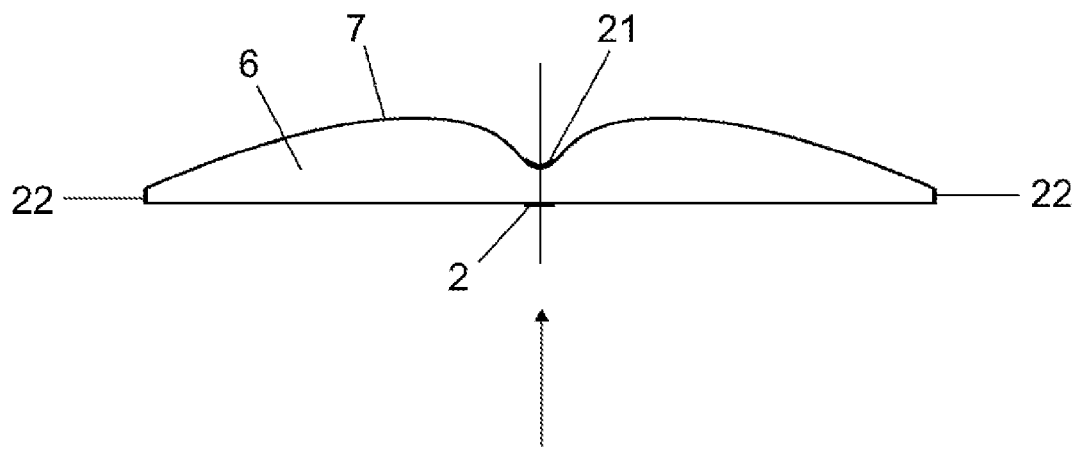
FIG. 2 shows a transparent body comprising an interface for the total reflection of pump light and additional mirrored regions.

For this reason, in the embodiment according to FIG. 2, a region 21 located above the exit surface 2 in the main propagation direction 3 is additionally mirrored, so that pump light beams propagating in the main propagation direction 3 are reflected back to the phosphor element 4, although the angle to the interface 7 is not sufficiently small for total reflection. Since the area proportion of the mirrored region 21 to the interface 7 is small, nonetheless, no substantial shading of the light emitted by the phosphor element 4 occurs.

In order to also reflect pump light beams lying close to the "sectional plane" to the phosphor element 4 or provide these beams for light mixing with converted light, an edge-side peripheral region of the transparent body 6 with respect to a direction perpendicular to the main propagation direction 3 is also surface treated; a diffusely reflective layer 22 is provided here.

Figure 3:
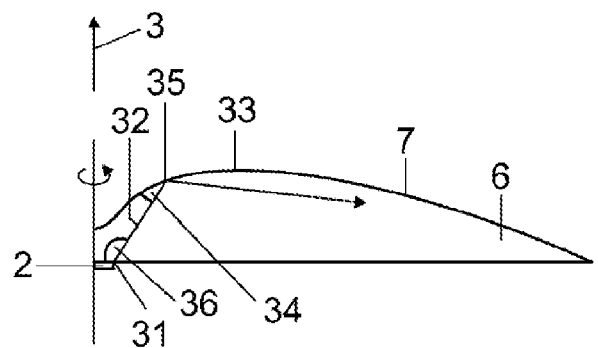
FIG. 3 shows a graphic representation of a design condition for the curvature of the interface of a transparent body according to FIGS. 1 and 2.

FIG. 3 illustrates a design condition for optimizing the interface curvature. A sectional plane which extends parallel to the main propagation direction 3 and through the center point of the rectangular exit surface 2, i.e., the plane of the drawing, is observed. Therein, a connecting line 32 is to be drawn from an edge point 31 of the exit surface 2 to the curved line 33 (this corresponds to the interface 7), wherein a total reflection of the beam occurs in the point of intersection 35 of connecting line 32 and curved line 33, if the angle 34 between connecting line 32 and curved line 33 is less than or equal to $\arccos(1/n_{silicone})$ (said angle corresponds to the angle between the connecting line 32 and a tangent at the point of intersection 35).

By observing the design condition for a connecting line 32 originating from the edge point 31, beams originating from inside the exit surface 2, i.e., in FIG. 3 beams originating on the left of the edge point 31, are also incident on the point of intersection 35 at an angle resulting in total reflection. The observation of the edge point 31 thus specifies the most demanding configuration with respect to the angle to be maintained for the total reflection.

In order to avoid a transparent body which becomes excessively thick in the main propagation direction 3 or which extends over an excessively large area perpendicular to the main propagation direction 3, the angle 34 is to be greater than or equal to ½ arccos ($1/n_{silicone}$), preferably greater than or equal to ¾ arccos ($1/n_{silicone}$), more preferably greater than or equal to ⅞ arccos ($1/n_{silicone}$). In order that a sufficient proportion of the pump light is totally reflected, the design condition is then to be met not only for a single connecting line 32 to the point of intersection 35, but rather for a plurality of connecting lines 32, which together subtend at least an angle range of 30°.

Since a design condition which ensures total reflection of the pump light for "central" and "edge-side" beams can be difficult to implement for manufacturing reasons, as explained in conjunction with FIG. 2, the connecting lines 32 which meet the design condition have an angle 36 between 90° and 150° to the exit surface 2.

The light-emitting surface of the LED 5, i.e., the exit surface 2, is perpendicular to the plane of the drawing and is implemented as square having an edge length of 2 mm. The maximum thickness, which is measured in the main propagation direction 3, of the transparent body 6 schematically shown here is 4 mm, its area perpendicular to the main propagation direction 3, i.e., the planar outer surface facing toward the phosphor element 4, is thus measured to be 2400 mm².

Figure 4:
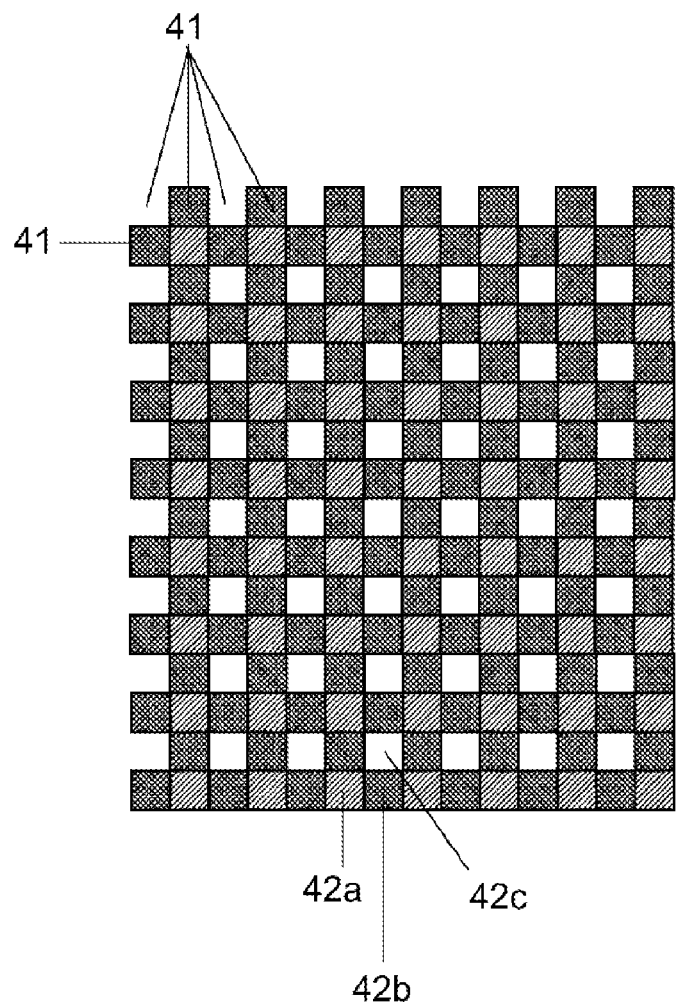
FIG. 4 shows a phosphor element having a plurality of phosphors, which is subdivided into a plurality of regions.

FIG. 4 shows a phosphor element 4, which is subdivided into a plurality of subregions 41, comprising three different phosphor types 42a, b, c, wherein one phosphor type 42 a, b, c is respectively provided in a plurality of regions 41. The phosphor types 42a, b, c are thus not mixed and then applied as a homogeneous layer, but rather are respectively provided individually in the subregions 41. In this manner, an interaction between the emission/absorption spectra of the phosphor types 42a, b, c can be avoided.

Figure 5:
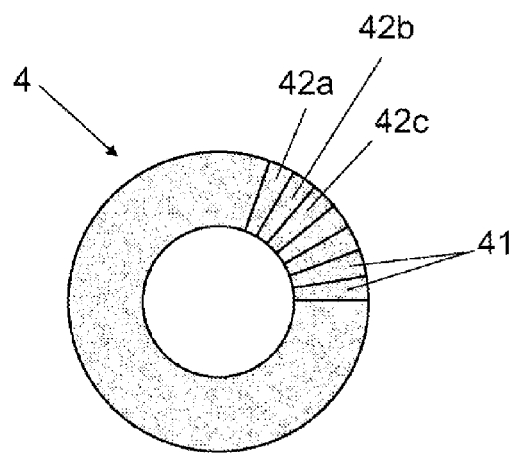
FIG. 5 shows a ring-shaped phosphor element comprising a central recess.

FIG. 5 shows a ring-shaped phosphor element 4, which is subdivided into regions 41 also having different phosphor types 42a, b, c (the subdivision is only illustrated for one subregion). A further subdivision can be performed, for example, by concentric circles, so that a grid similar to FIG. 4 results.

A ring-shaped phosphor element 4 according to FIG. 5 can however also be provided with only one phosphor type or a homogeneous phosphor mixture without a subdivision and is particularly advantageous in conjunction with the rotationally-symmetrical reflection surface illustrated in FIG. 3, because it totally reflects the pump light in a ring-shaped region.

Figure 6:
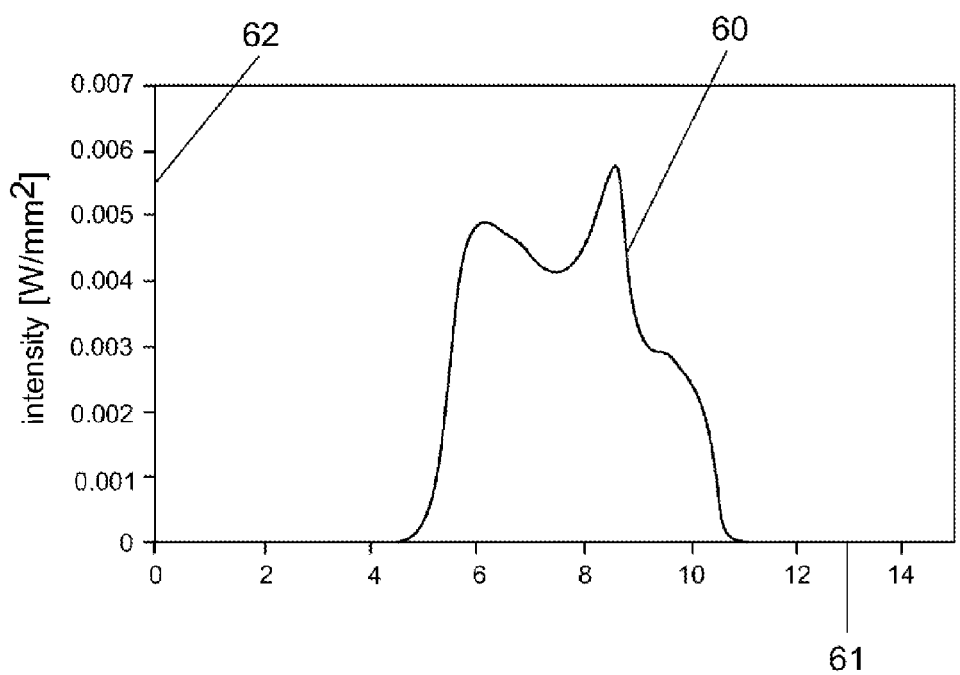
FIG. 6 shows a radial distribution of pump light which is totally reflected on a transparent body according to FIGS. 1 to 3.

FIG. 6 shows, as a simulation result, a corresponding distribution of the pump light intensity 60 on the phosphor 4 in the radial direction; the pump light is totally reflected in this case at an interface 33 designed according to the explanations of FIG. 3. The distance to the axis of symmetry in millimeters is specified on the horizontal axis 61, and the power density in watts/mm² is plotted on the vertical axis 62. The vertical axis 62 is coincident with the axis of symmetry from FIG. 3, the pump light is distributed in a ring shape in consideration of the rotational symmetry.

Figure 7:
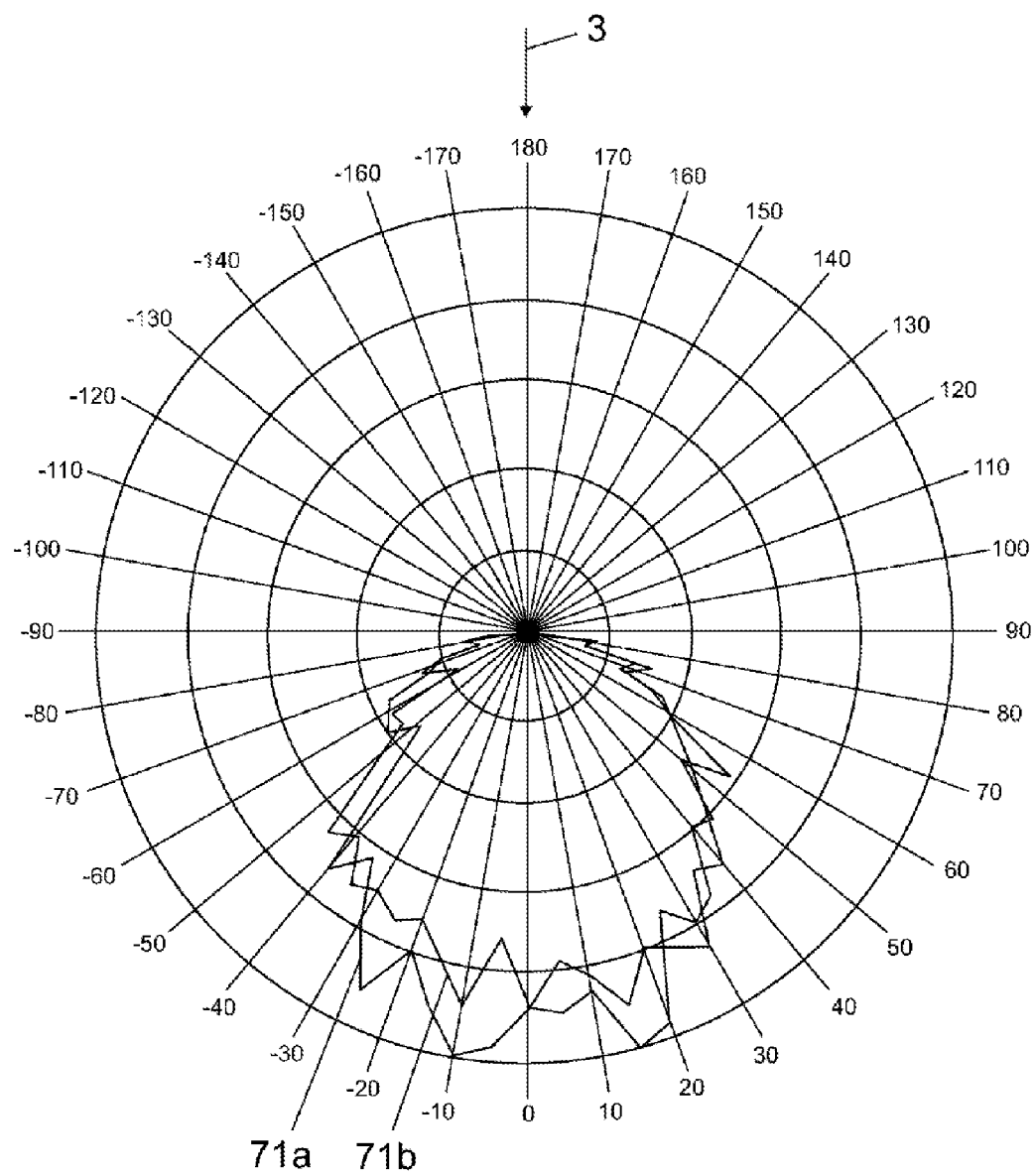
FIG. 7 shows a distribution of the converted light of a phosphor element illuminated in a ring shape according to FIG. 6 in the far field.

FIG. 7 illustrates the radiation intensity in the far field of the converted light emitted from a phosphor element 4 illuminated correspondingly in a ring shape with pump light. The radiation intensity is plotted proceeding from a total light power of 1 W in W/sr (sr=steradian). The curves 71a, b then specify the radiation intensity in two sectional planes perpendicular to one another. Since the simulation was carried out using a finite number of statistically distributed discrete beams, in spite of the rotational symmetry of phosphor element 4 and optical system 6, a deviation of the two curves 71a, b from one another can be recognized. Because of a lens effect of the optical system 6, the light, which is emitted by the phosphor element 4 in a Lambertian manner in the main propagation direction 3 (the geometry from FIG. 1 is rotated by 180° in a hemisphere, is partially bundled and as a result emitted in a directed manner.

While the disclosure has been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

The invention claimed is:

1. An illumination device comprising
a phosphor element for a conversion of pump light to converted light,
a pump light source comprising an exit surface for pump light, which has a main propagation direction formed as the focal point of propagation directions weighted according to the power in relation to the exit surface, and
an optical system comprising a reflection surface, which is designed for the purpose of redirecting at least a part of the pump light propagating in the main propagation direction such that it is incident on the phosphor element with a directional component opposing the main propagation direction, which phosphor element then emits converted light with a directional component oriented parallel to the main propagation direction and is thus operated in reflection,
wherein at least one region of the reflection surface extends transversely to the main propagation direction and is designed for the purpose of at least partially transmitting the converted light,
wherein the optical system has a transparent body comprising a curved interface facing away from the phosphor element, wherein the transparent body has a first index of refraction and borders with said interface on a medium having a lesser second index of refraction, so that the interface is at least partially implemented as a reflection surface and the redirection is performed by a total reflection, and
wherein the transparent body has an index of refraction $n_{tk}$ and the interface is curved such that, in a sectional plane which is parallel to the main propagation direction and extends through the exit surface, a curved line corresponding to the interface is implemented with respect to a point lying in the exit surface such that there are at least two connecting lines from the point to the curved line, wherein each line encloses an angle between each connecting line and the curved line, wherein each angle satisfies angle≤arccos ($1/n_{tk}$) therewith, wherein the at least two connecting lines together subtend at least an angle range of 30°.

2. The illumination device as claimed in claim 1, wherein the connecting lines, which together subtend an angle of at least 30°, enclose an angle of at least 80° and of at most 185° with the exit surface.

3. The illumination device as claimed in claim 1, wherein the curved line is bent at a plurality of points, so that the interface is implemented as faceted.

4. The illumination device as claimed in claim 1, comprising a plurality of curved lines, which can be converted into one another by either a rotation about an axis parallel to the main propagation direction or a parallel displacement along an axis perpendicular to the main propagation direction.

5. An illumination device comprising
- a phosphor element for a conversion of pump light to converted light,
- a pump light source comprising an exit surface for pump light, which has a main propagation direction formed as the focal point of propagation directions weighted according to the power in relation to the exit surface, and
- an optical system comprising a reflection surface, which is designed for the purpose of redirecting at least a part of the pump light propagating in the main propagation direction such that it is incident on the phosphor element with a directional component opposing the main propagation direction, which phosphor element then emits converted light with a directional component oriented parallel to the main propagation direction and is thus operated in reflection,
- wherein at least one region of the reflection surface extends transversely to the main propagation direction and is designed for the purpose of at least partially transmitting the converted light,
- wherein the optical system has a transparent body comprising a curved interface facing away from the phosphor element, wherein the transparent body has a first index of refraction and borders with said interface on a medium having a lesser second index of refraction, so that the interface is at least partially implemented as a reflection surface and the redirection is performed by a total reflection, and
- wherein an extension surface area of the transparent body perpendicular to the main propagation direction corresponds to at least 110 times, but at most 1700 times the exit surface.

6. An illumination device comprising
- a phosphor element for a conversion of pump light to converted light,
- a pump light source comprising an exit surface for pump light, which has a main propagation direction formed as the focal point of propagation directions weighted according to the power in relation to the exit surface, and
- an optical system comprising a reflection surface, which is designed for the purpose of redirecting at least a part of the pump light propagating in the main propagation direction such that it is incident on the phosphor element with a directional component opposing the main propagation direction, which phosphor element then emits converted light with a directional component oriented parallel to the main propagation direction and is thus operated in reflection,
- wherein at least one region of the reflection surface extends transversely to the main propagation direction and is designed for the purpose of at least partially transmitting the converted light,
- wherein the optical system has a transparent body comprising a curved interface facing away from the phosphor element, wherein the transparent body has a first index of refraction and borders with said interface on a medium having a lesser second index of refraction, so that the interface is at least partially implemented as a reflection surface and the redirection is performed by a total reflection, and
- wherein the exit surface is implemented as rectangular and the transparent body has a thickness in the main propagation direction which is at least 0.8 times a shorter edge of the rectangular exit surface, but at most 5 times a longer edge of the rectangular exit surface.

7. An illumination device comprising
- a phosphor element for a conversion of pump light to converted light,
- a pump light source comprising an exit surface for pump light, which has a main propagation direction formed as the focal point of propagation directions weighted according to the power in relation to the exit surface, and
- an optical system comprising a reflection surface, which is designed for the purpose of redirecting at least a part of the pump light propagating in the main propagation direction such that it is incident on the phosphor element with a directional component opposing the main propagation direction, which phosphor element then emits converted light with a directional component oriented parallel to the main propagation direction and is thus operated in reflection,
- wherein at least one region of the reflection surface extends transversely to the main propagation direction and is designed for the purpose of at least partially transmitting the converted light,
- wherein the optical system has a transparent body comprising a curved interface facing away from the phosphor element, wherein the transparent body has a first index of refraction and borders with said interface on a medium having a lesser second index of refraction, so that the interface is at least partially implemented as a reflection surface and the redirection is performed by a total reflection, and
- wherein a region of the interface facing away from the phosphor element is additionally surface treated, wherein this region is arranged, in the main propagation direction, originating from the exit surface.

8. An illumination device comprising
- a phosphor element for a conversion of pump light to converted light,
- a pump light source comprising an exit surface for pump light, which has a main propagation direction formed as the focal point of propagation directions weighted according to the power in relation to the exit surface, and
- an optical system comprising a reflection surface, which is designed for the purpose of redirecting at least a part of the pump light propagating in the main propagation direction such that it is incident on the phosphor element with a directional component opposing the main propagation direction, which phosphor element then emits converted light with a directional component oriented parallel to the main propagation direction and is thus operated in reflection,
- wherein at least one region of the reflection surface extends transversely to the main propagation direction and is designed for the purpose of at least partially transmitting the converted light,
- wherein the optical system has a transparent body comprising a curved interface facing away from the phosphor element, wherein the transparent body has a first index of refraction and borders with said interface on a medium having a lesser second index of refraction, so that the interface is at least partially implemented as a reflection surface and the redirection is performed by a total reflection, and
- the illumination device, comprising an immersion layer, via which both the phosphor element and also the exit surface are optically connected to an outer surface of the transparent body facing toward the phosphor element.

9. An illumination device comprising
- a phosphor element for a conversion of pump light to converted light, a pump light source comprising an exit surface for pump light which has a main propagation direction formed as the focal point of propagation directions weighted according to the power in relation to the exit surface, and an optical system comprising a reflection surface, which is designed for the purpose of redirecting at least a part of the pump light propagating in the main propagation direction such that it is incident on the phosphor element with a directional component opposing the main propagation direction, which phosphor element then emits converted light with a directional component oriented parallel to the main propagation direction and is thus operated in reflection, wherein at least one region of the reflection surface extends transversely to the main propagation direction and is designed for the purpose of at least partially transmitting the converted light, wherein the optical system has a transparent body comprising a curved interface facing away from the phosphor element, wherein the transparent body has a first index of refraction and borders with said interface on a medium having a lesser second index of refraction, so that the interface is at least partially implemented as a reflection surface and the redirection is performed by a total reflection, and wherein the transparent body consists of plastic material and is molded onto the exit surface and the phosphor element.

10. The illumination device as claimed in claim 1, wherein the transparent body has a lateral outer surface oriented along the main propagation direction, which is additionally surface treated for the purpose of pump light reflection and thus delimits a lateral light exit from the optical system.

11. The illumination device as claimed in claim 1, comprising a cooling body, wherein the pump light source and the phosphor element are arranged on the same cooling body.

12. The illumination device as claimed in claim 1, wherein the phosphor element is subdivided into regions and has a plurality of phosphors designed to emit respectively differing light, wherein one phosphor is respectively arranged in a plurality of regions and is respectively exclusively arranged therein.

* * * * *